(12) United States Patent
Yung et al.

(10) Patent No.: US 8,387,851 B1
(45) Date of Patent: Mar. 5, 2013

(54) APPARATUS FOR ALIGNING A BONDING TOOL OF A DIE BONDER

(75) Inventors: Chung Sheung Yung, Hong Kong (CN); Shing Lui Lau, Hong Kong (CN); Chi Ming Chong, Hong Kong (CN); Gary Peter Widdowson, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/463,910

(22) Filed: May 4, 2012

(51) Int. Cl.
*B23K 37/00* (2006.01)
(52) U.S. Cl. .............................. 228/4.1; 228/6.2; 228/8
(58) Field of Classification Search .................. None
See application file for complete search history.

(56) References Cited

U.S. PATENT DOCUMENTS

| | | | | |
|---|---|---|---|---|
| 4,799,854 A | * | 1/1989 | Niskala | 414/737 |
| 4,875,614 A | * | 10/1989 | Cipolla et al. | 228/5.5 |
| 5,591,295 A | * | 1/1997 | Onitsuka | 156/363 |
| 5,599,159 A | * | 2/1997 | Sugiura et al. | 414/744.3 |
| 6,156,150 A | * | 12/2000 | Nishida | 156/701 |
| 7,849,896 B2 | * | 12/2010 | Choy et al. | 156/351 |
| 8,256,103 B2 | * | 9/2012 | Choy et al. | 29/762 |
| 2003/0006013 A1 | * | 1/2003 | Kawashima et al. | 156/499 |
| 2007/0040455 A1 | * | 2/2007 | Haraguchi | 310/12 |
| 2010/0074722 A1 | * | 3/2010 | Noda | 414/751.1 |
| 2010/0314050 A1 | * | 12/2010 | Wong et al. | 156/538 |
| 2011/0048648 A1 | * | 3/2011 | Ng et al. | 156/538 |
| 2011/0214282 A1 | * | 9/2011 | Choy et al. | 29/740 |
| 2011/0215134 A1 | * | 9/2011 | Sim | 228/101 |

* cited by examiner

*Primary Examiner* — Kiley Stoner
(74) *Attorney, Agent, or Firm* — Sughrue Mion, PLLC

(57) ABSTRACT

An apparatus for aligning a bonding tool of a die bonder with respect to a bond stage is disclosed. The apparatus comprises: a connecting member to which the bonding tool is coupleable such that the connecting member is located between the bonding tool and a main body of a die bonder; and a plurality of actuators engaged to the connecting member. In particular, the plurality of actuators are actuable to rotate the connecting member and the bonding tool relative to the main body of the die bonder about a plurality of axes, to align the bonding tool with respect to the bond stage.

15 Claims, 8 Drawing Sheets

APPARATUS FOR ALIGNING A BONDING TOOL OF A DIE BONDER

FIELD OF THE INVENTION

This invention relates to an apparatus for aligning a bonding tool of a die bonder. The apparatus is particularly, but not exclusively, applicable as an alignment device to align the bonding tool of a die bonder with a bond stage before semiconductor dies are bonded to a semiconductor die carrier that is supported by the bond stage.

BACKGROUND OF THE INVENTION

A die bonder is an apparatus that picks a semiconductor die from a supply of semiconductor dies (e.g. a wafer tray) and places it on a semiconductor die carrier (e.g. a lead frame). Such a process is known as die bonding. The die bonder comprises two important modules: i) a bond head for transferring and bonding the semiconductor die to the semiconductor die carrier and ii) a bond stage for supporting the semiconductor die carrier during the die bonding process. To ensure the quality and reliability of the die bonding process, the bond head and the bond stage should be mutually aligned. Accordingly, the surfaces of the bond head and the bond stage facing each other should be parallel to each other before the semiconductor die carrier is placed on the bond stage for die bonding. During die bonding, a bonding surface of the semiconductor die is pressed by the bond head against the semiconductor die carrier with a designated force and under a certain temperature profile. Since the bonding surface of the semiconductor die includes many solder or gold bumps with dimensions not exceeding a few hundred microns, a small deviation of the alignment of the bond stage with respect to the bond stage (e.g. 10 microns) might result in side forces and placement error, which thereby compromises the quality and reliability of the die bonding process. Importantly thus, alignment of the bond head with respect to the bond stage should be maintained to ensure the quality and reliability of the die bonder.

Accordingly, it is an object of the present invention to seek to propose an apparatus that ensures the parallelism of the surfaces of the bond head and the bond stage facing each other, and hence, the alignment of the bond head relative to the bond stage.

BRIEF DESCRIPTION OF THE DRAWINGS

The preferred embodiment of this invention will now be described, by way of example only, with reference to the drawings of which:

FIG. 7a shows the bond head alignment apparatus in a first equilibrium position with respect to a first rotational axis, while FIG. 8a shows the bond head alignment apparatus in a first equilibrium position with respect to a second rotational axis, while

SUMMARY OF THE INVENTION

A first aspect of the present invention is an apparatus for aligning a bonding tool of a die bonder with respect to a bond stage. The apparatus comprises: a connecting member to which the bonding tool is coupleable such that the connecting member is located between the bonding tool and a main body of a die bonder; and a plurality of actuators engaged to the connecting member. In particular, the plurality of actuators are actuable to rotate the connecting member and the bonding tool relative to the main body of the die bonder about a plurality of axes, to align the bonding tool with respect to the bond stage.

A second aspect of the invention is a die bonder bond head comprising: a main body; the apparatus according to the first aspect of the invention coupled to the main body; and a bonding tool coupled to the apparatus. In particular, the bonding tool is actuable by the apparatus relative to the main body for alignment with respect to a bond stage.

Some preferred but optional features of the first and second aspects of the inventions have been defined in the dependent claims.

DETAILED DESCRIPTION OF THE PREFERRED EMBODIMENT

Figure 1:
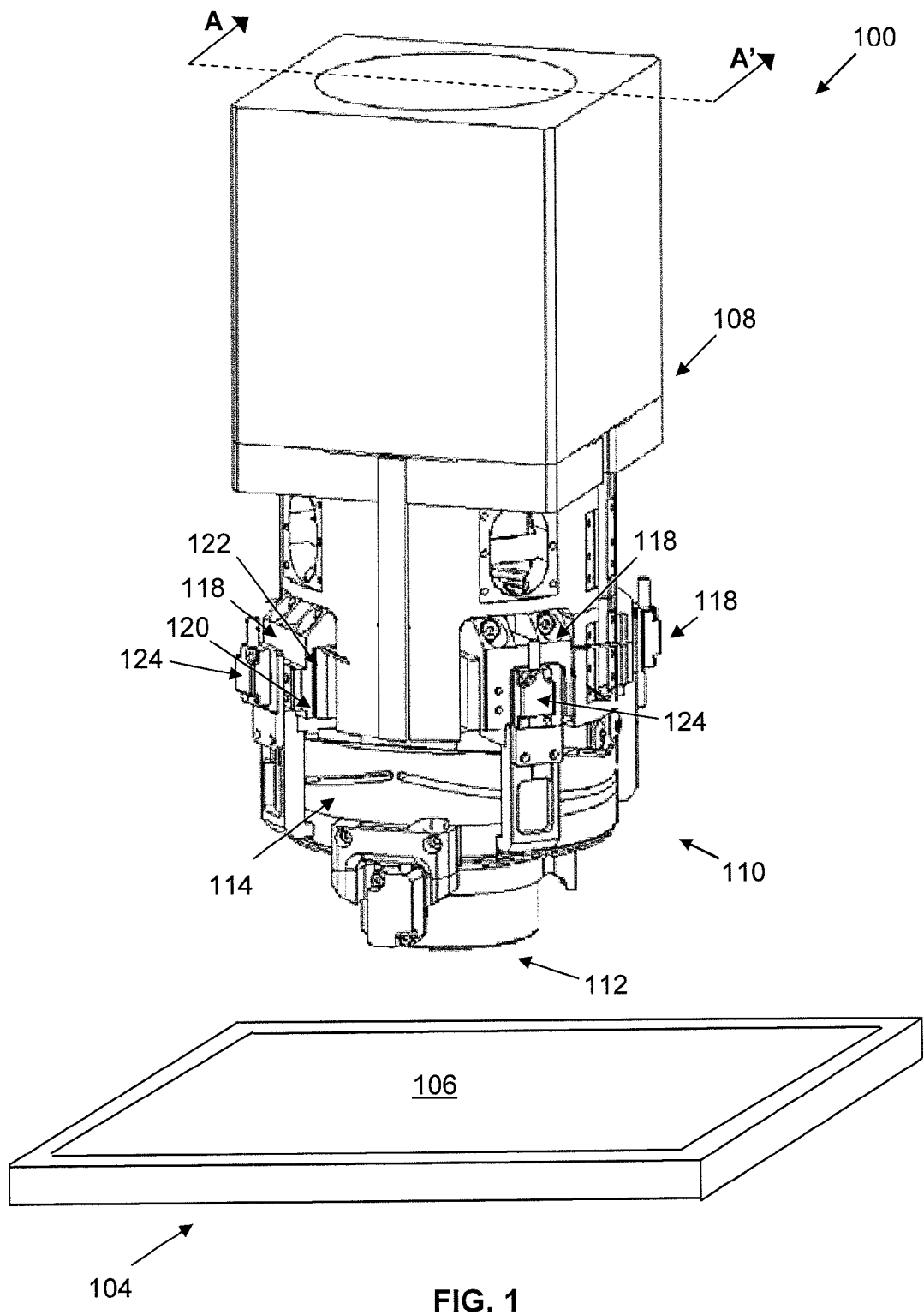
FIG. 1 is an isometric view of a bond head, comprising a bond head alignment apparatus according to the preferred embodiment.

FIG. 1 is an isometric view of a bond head 100 of a die bonder for bonding a semiconductor die (not shown) to a semiconductor die carrier (shown as a lead frame 106) supported by a bond stage 104. The bond head 100 comprises: i) a main body 108; ii) a bond head alignment apparatus 110 of the preferred embodiment coupled to the main body 108; and iii) a bonding tool (shown as a die collet 112) coupled to the bond head alignment apparatus 110 for holding and transferring the semiconductor die to the lead frame 106. The bond head alignment apparatus 110 defines a flexural stage movable with respect to the main body 108. Specifically, a mini Z-axis defined by the bond head alignment apparatus 110 is adjustably movable relative to a fixed main Z-axis defined by the main body 108. Since the die collet 112 is coupled to the bond head alignment apparatus 110, positional adjustment of the bond head alignment apparatus 110 can ensure the parallelism of the surfaces of the die collet 112 and the bond stage 104 facing each other. Consequently, the semiconductor die that is held by the die collet 112 can be aligned with respect to the lead frame 106 that is supported by the bond stage 104.

Referring to FIG. 1, it is seen that the bond head alignment apparatus 110 includes: i) a connecting member (shown as a ring member 114 having a plurality of openings) to which the die collet 112 is coupleable; ii) a plurality of actuators (shown as solenoid actuators 118), each solenoid actuator 118 being configured to engage with the ring member 114 via a respective one of the plurality of openings; and iii) a plurality of linear encoders 124, each linear encoder 124 being configured to measure a magnitude of a linear displacement of the ring member 114 during operation. Accordingly, the solenoid actuators 118 and the linear encoders 124 are mutually cooperative to rotate the ring member 114 relative to the main body 108 about a plurality of rotational axes to maintain the parallelism of the surfaces of the die collet 112 and the bond stage 104 facing each other. Consequently, the semiconductor die that is held by the die collet 112 can be aligned with respect to the lead frame 106 that is supported by the bond stage 104.

Figure 2:
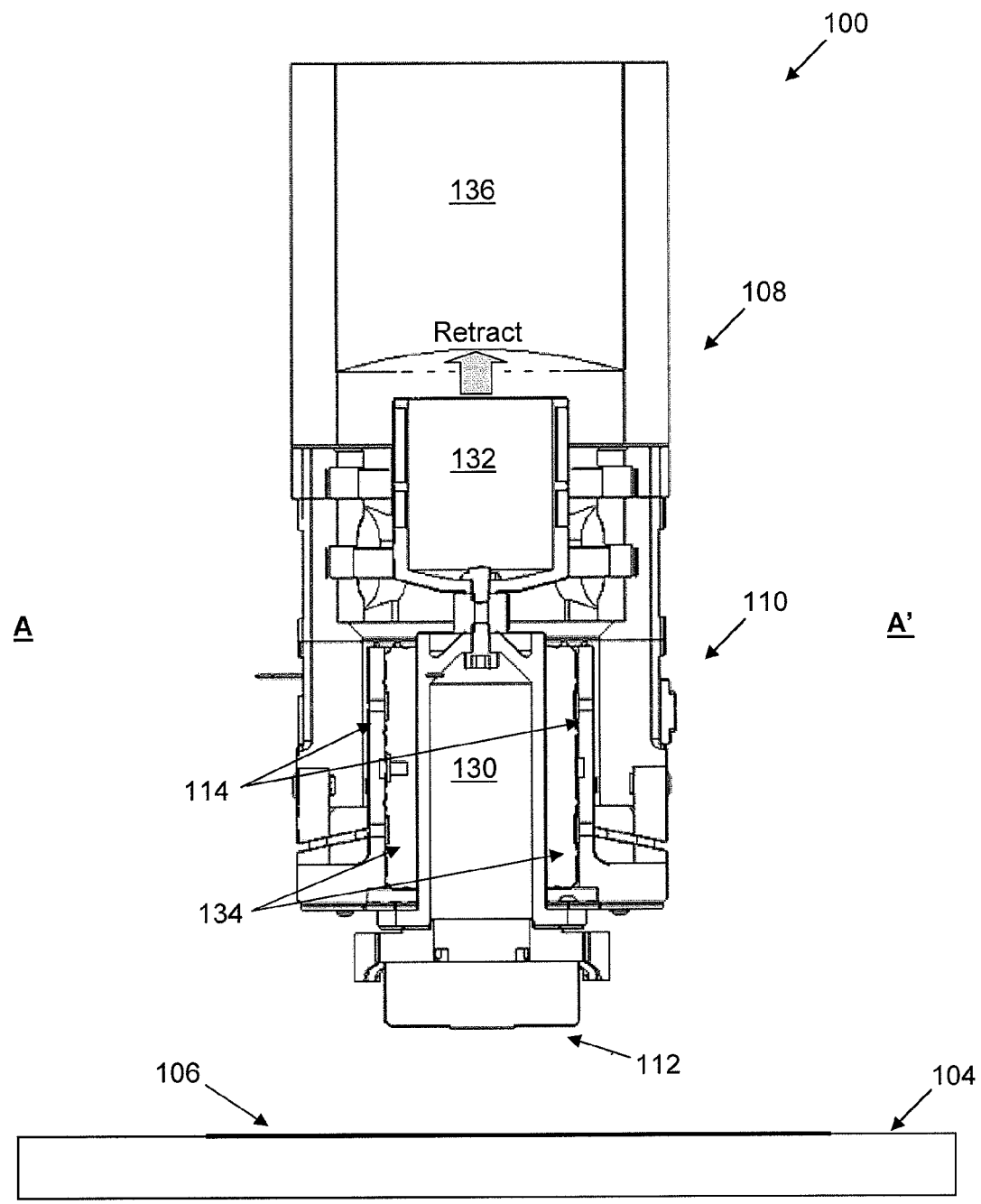
FIG. 2 is a cross-sectional view of the bond head of FIG. 1.

FIG. 2 is a cross-sectional view of the bond head 100 of FIG. 1 looking along line A-A' as shown in FIG. 1. In particular, the bond head alignment apparatus 110 further includes a bonding tool holder comprising: i) a bushing bearing 134; and ii) a bearing shaft 130 coupled to the bushing bearing 134. Specifically, the bushing bearing 134 is coupled to the ring member 114, and the die collet 112 is coupleable to the bearing shaft 130, so that a rotary motion of the ring member 114 is transferrable to the die collet 112 via the bonding tool holder for alignment of the die collet 112 with the bond stage 104. The bearing shaft 130 is further connected to a voice coil motor 132, which is operable to move the bondhead alignment apparatus 110 along a longitudinal axis of the main body 108 to press the bondhead alignment apparatus 110 against a surface of a top portion 136 of the bond head 100. This is effective in locking the position of the bond head alignment apparatus 110—and thus the die collet 112—relative to the main body 108 of the bond head 100, after the bond head alignment apparatus 110 has been aligned with respect to the bond stage 104. This secures the alignment of the die collet 112 in position. By forming a force linkage between the main body 108 and the bond head alignment apparatus 110, a bonding force for bonding the semiconductor die to the lead frame 106 can be provided from the main body 108 of the die bonder to the bond head alignment apparatus 110, rather than a force solely provided from the bond head alignment apparatus 110 through, for example, the voice coil motor 132 alone.

Figure 3:
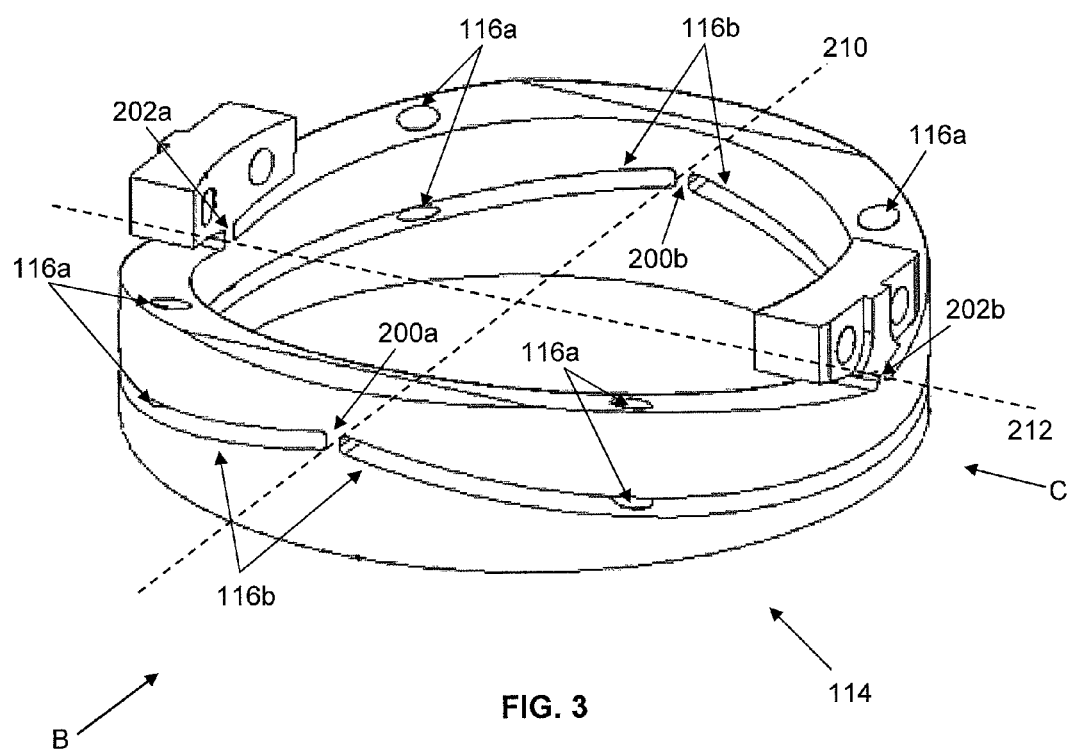
FIG. 3 is an isometric view of a ring member of the bond head alignment apparatus.

FIG. 3 is an isometric view of the ring member 114 of the bond head alignment apparatus 110. It can be seen that the plurality of openings of the ring member 114 include bore openings 116a around a circumferential wall of the ring member 114 and extending from an upper surface of the circumferential wall. In particular, each of the plurality of solenoid actuators 118 engages with a respective one of these bore openings 116a. Upon engagement between the solenoid actuators 118 and the bore openings 116, actuation of the solenoid actuators 118 accordingly rotate the ring member 114 about the plurality of rotational axes relative to the main body 108 to align the die collet 112 with the bond stage 104.

Also, it can be seen that the plurality of openings of the ring member 114 include a plurality of slots 116b around the circumferential wall of the ring member 114. Specifically, the plurality of slots 116b are formed by removing cutouts from the ring member 114 through wire-cutting. In particular, the cutouts are removed from the ring member 114 to form a first pair of opposite joints 200a, 200b between adjacent slots 116b in the ring member 114—the first pair of opposite joints 200a, 200b defines a first rotational axis 210 about which the ring member 114 is actuable by the plurality of solenoid actuators 118 to rotate, to thereby align the die collet 112 with the bond stage 104. Moreover, a second pair of opposite joints 202a, 202b is formed on the upper surface of the circumferential wall of the ring member 114—this second pair of opposite joints 202, 202b defines a second rotational axis 212 about which the ring member 114 is actuable by the plurality of solenoid actuators 118 to rotate, to thereby align the die collet 112 with the bond stage 104.

From FIG. 3, it can also be seen that the second pair of opposite joints 202a, 202b are orthogonally-arranged with respect to the first pair of opposite joints 200a, 200b. Thus, the two rotational axes defined by the two pairs of opposite joints 200a-b, 202a-b of the ring member 114 provide a two-degree freedom of motion of the bond head alignment apparatus 110 within a defined three-dimensional space.

Figure 4A:
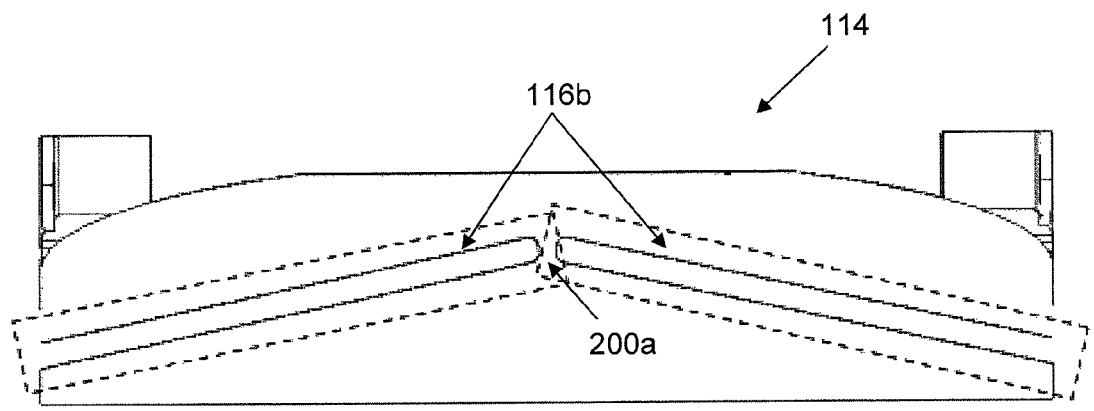
FIGS. 4a and 4b are various side views of the ring member of FIG. 3.
Figure 4B:
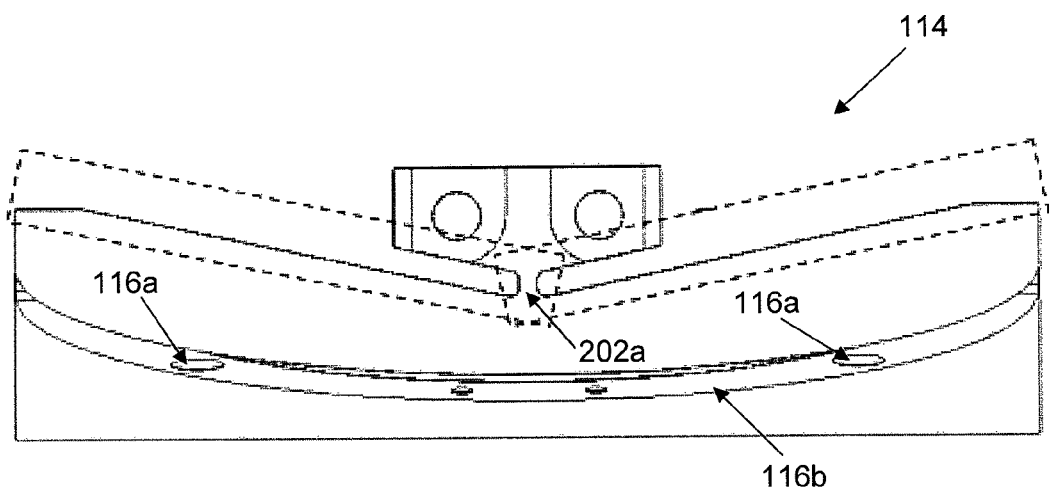

FIGS. 4a and 4b are different side views of the ring member 114 when viewed from directions B and C shown in FIG. 3 respectively. Specifically, the first pair of opposite joints 200a, 200b is formed by removing two cutouts from the circumferential wall of the ring member 114 by wire-cutting, such that each of the opposite joints 200a, 200b forms an apex of an inverted V-shaped cutout from a side view. As for the second pair of opposite joints 202a, 202b, it is formed by shaping the upper surface of the ring member 114 such that each of the opposite joints 202a, 202b forms a base of a V-shaped cutout. In this way, the rotational axes defined by the two pairs of opposite joints 200a-b, 202a-b of the ring member 114 can be arranged on a common horizontal plane; that is, the rotational axes of the bond head alignment apparatus 110 are at a common Z-level or a common height. Such an arrangement of the rotational axes may advantageously simplify the construction of the bond head alignment apparatus 110, since the two rotational axes of the ring member 114 can be calibrated using a common measurement scale.

It should, nevertheless, be appreciated that the plurality of slots 116b and the first pair of opposite joints 200a, 200b may be formed by cutouts of other shapes, such as a U-shaped cutouts.

Figure 5:
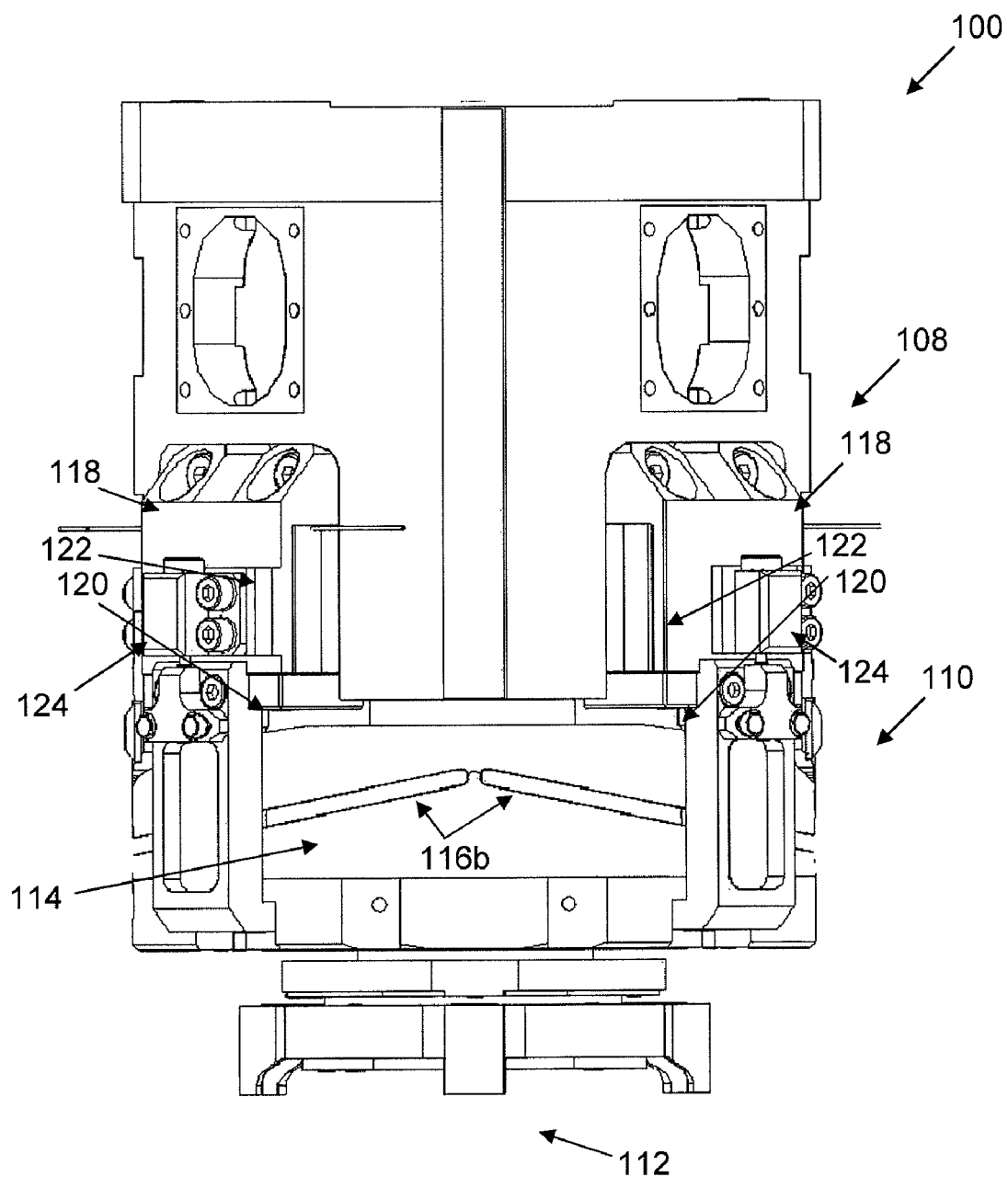
FIG. 5 is a side view of the bond head of FIG. 1.

FIG. 5 shows a close-up view of the bond head 100 of FIG. 1. Specifically, each solenoid actuator 118 comprises: i) an armature 120 (e.g. a movable iron or steel slug) engaged to a respective one of the bore openings 116a of the ring member 114. Each solenoid actuator 118 also comprises an electrical coil 122 that is connected to an external current supply. When current flows from the external current supply through the electrical coil 122, a magnetic field accordingly forms around the electrical coil 122, which attracts the armature 120 upwards along the centre of the electrical coil 122. Since the ring member 114 is engaged to the armature 120 via the corresponding bore opening 116, the ring member 114 is thus driven by the armature 120 to move when current flows through the electrical coil 122.

Magnetic flux density of the magnetic field within the electrical coil 122 is defined by the formula, as follows:

$$B = \mu_0 \frac{NI}{L}$$

where $\mu_0$ is the magnetic constant, N is the number of turns of the electrical coil 122, I is the magnitude of the electrical current flowing through the electrical coil 122, and L is the length of the electrical coil 122.

Thus, by varying the magnitude of the electrical current flowing through the electrical coil 122, the linear displacement of the armature 120—and hence, the corresponding motion of the ring member 114 and the die collet 112—is controllable by a processor of the bond head 100. It should, of course, be appreciated that other types of actuators (e.g. voice coil motors) may be used instead of the solenoid actuators 118.

Figure 6:
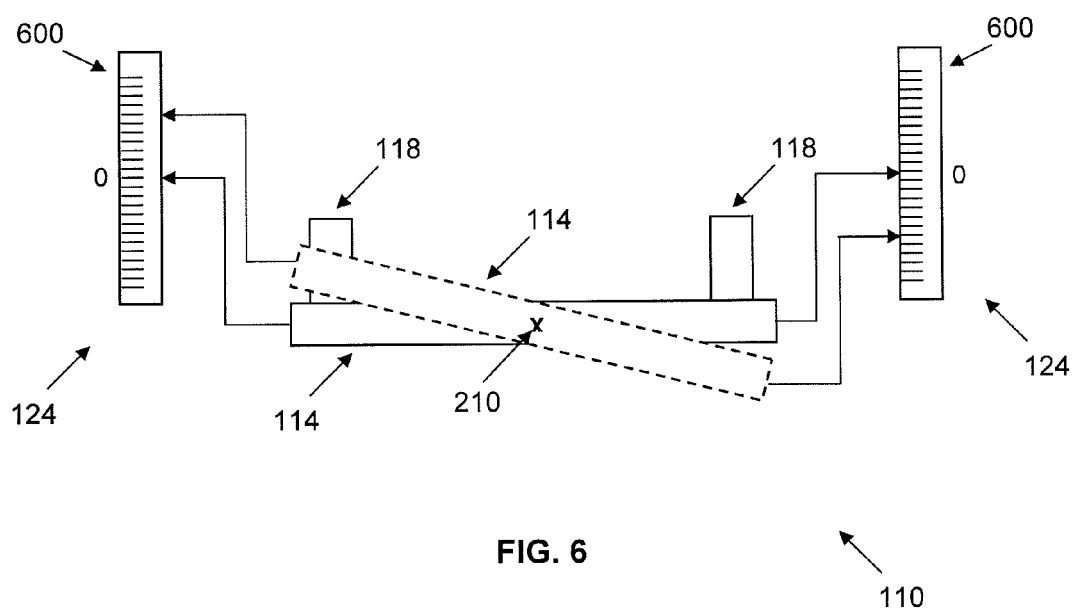
FIG. 6 shows an operation of the bond head alignment apparatus wherein the ring member of FIGS. 4a and 4b is rotated about an axis.

In addition, the bond head alignment apparatus 100 also includes a plurality of linear encoders 124. FIG. 6 shows two linear encoders 124 connected to the ring member 114 to determine corresponding magnitudes of linear displacement of the ring member 114 due to its rotational motion around the first rotational axis 210 during operation. As the solenoid actuators 118 to the left of the first rotational axis 210 retract due to attraction of the armature 120 upwards relative to the electromagnetized electrical coil 122 when electrical current flows from the external current supply through the electrical coil 122, the ring member 114 rotates in a clockwise direction about the first rotational axis 210, as shown in FIG. 6. Each of the linear encoders 124 then reads from a scale 600 that indicates a position of the ring member 114 and converts the encoded position into a digital signal that can be decoded into positional information by the processor of the bond head 100. Instead of both the solenoid actuators 118 to the left of the first rotational axis 210 being retracted to rotate the ring member 114 about the first rotational axis 210, retraction of just one of the two solenoid actuators 118 may suffice in realizing the rotational motion of the ring member 114.

It should be appreciated that rotation of the ring member 114 in an anti-clockwise direction about the first rotational axis 210 can be effected by retracting the solenoid actuators 118 to the right of the first rotational axis 210. Similarly, rotation of the ring member 144 in clockwise and anti-clockwise direction about the second rotational axis 212 can be effected by retracting the solenoid actuators 118 to the left and the right of the second rotational axis 212 respectively. Also, it should be appreciated that the linear encoder 124 can be any type of measuring device that measures a magnitude of linear displacement of the ring member 114, such as a linear variable differential transformer (LVDT) or an optical encoder that uses a light source (e.g. an infrared light source).

FIGS. 7a-7b and 8a-8b show an operation of the bond head alignment apparatus 110.

Figure 7A:
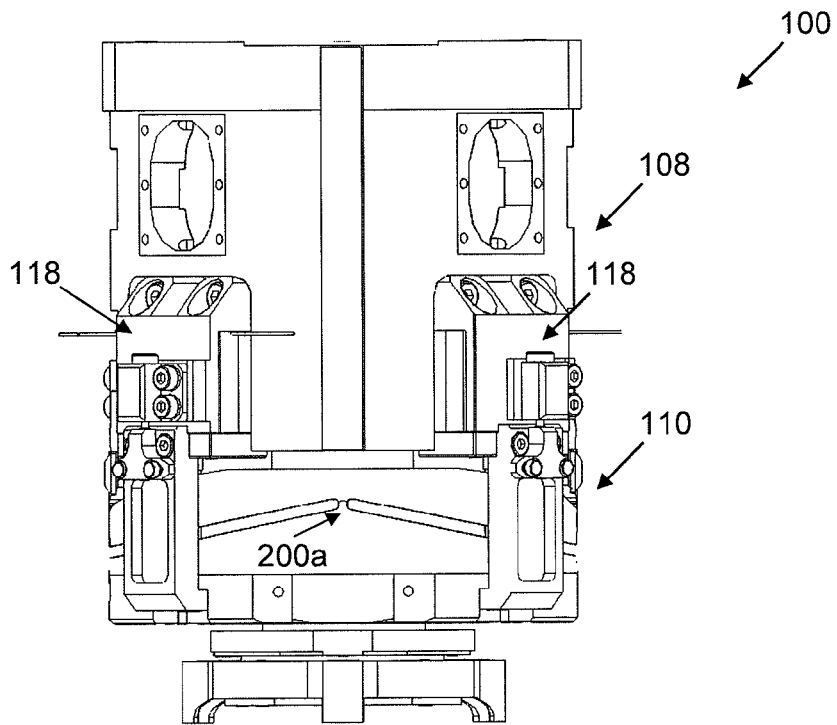
Figure 8A:
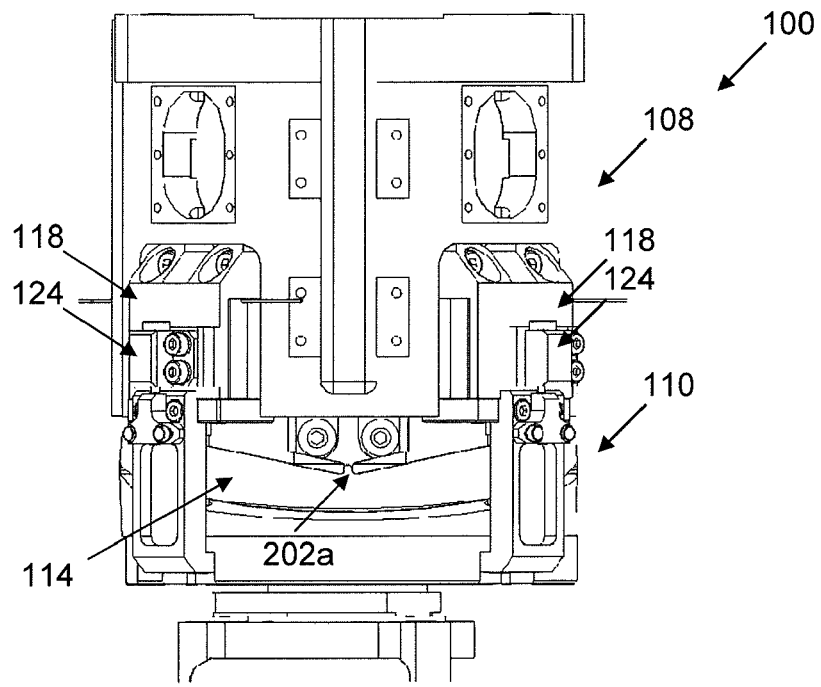

FIGS. 7a and 8a show initial equilibrium positions of the bond head alignment apparatus 100 with respect to the first and second rotational axes 210, 212 respectively. As mentioned, the first rotational axis 210 is defined by the first pair of opposite joints 200a-b while the second rotational axis 212 is defined by the second pair of opposite joints 202a-b. During operation, the parallelism of the die collet 112 relative to the bond stage 104 is first determined by measuring a tilt angle of the bond head alignment apparatus 110 relative to the bond stage 104 using a sensor. Such a sensor may either be a contact sensor, or a non-contact sensor. The measured tilt angles of the bond head alignment apparatus 110 relative to the bond stage 104 are then fed back to the processor, which accordingly sends a controlling signal to actuate the solenoid actuators 118 to compensate for and adjust any alignment error of the bond head alignment apparatus 110 relative to the bond stage 104.

Figure 7B:
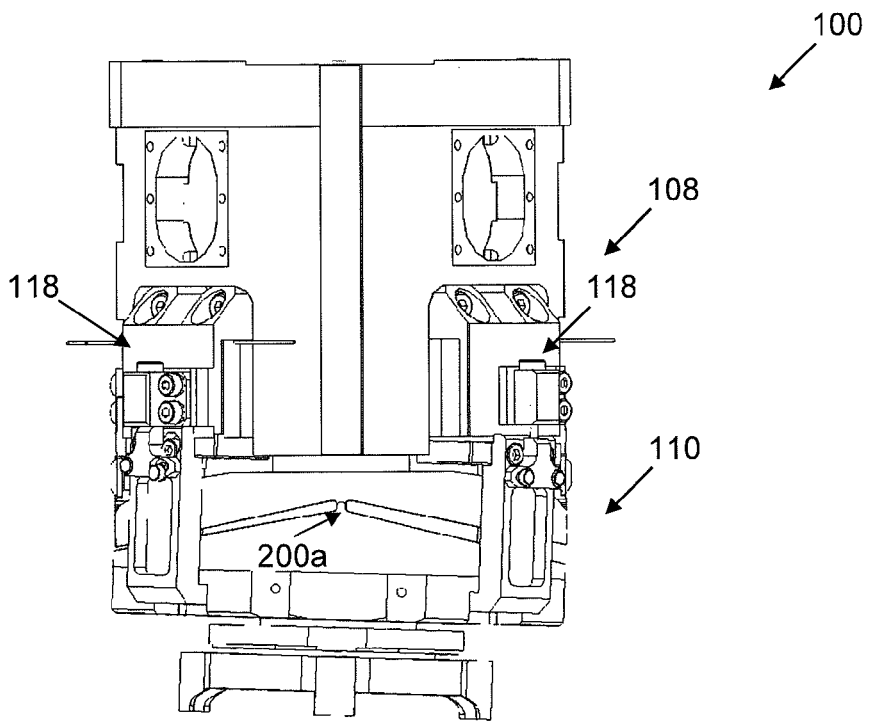
FIG. 7b shows the bond head alignment apparatus rotated about the first rotational axis to another position.
Figure 8B:
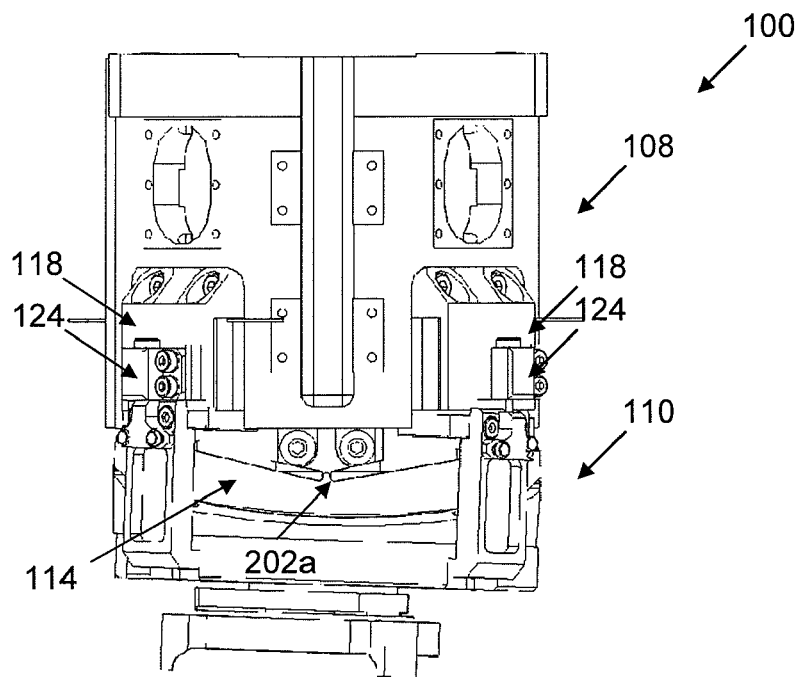
FIG. 8b shows the bond head alignment apparatus rotated about the second rotational axis to another position.

If there is an excessive tilt angle of the bond head alignment apparatus 110 relative to the bond stage 104 to the right of the first rotational axis 210, the die collet 112 would be misaligned relative to the bond stage 104. In such an instance, the solenoid actuators 118 to the left of the first rotational axis 210 would be retracted so that the bond head alignment apparatus 110 rotates clockwise about the joint 200a—as shown in FIG. 7b. If there is an excessive tilt angle of the bond head alignment apparatus 110 relative to the bond stage 104 to the right of the second rotational axis 212, the die collet 112 would also be misaligned relative to the bond stage 104. In such an instance, the solenoid actuators 118 to the left of the second rotational axis 212 would also be retracted so that the bond head alignment apparatus 110 rotates clockwise about the joint 202a—as shown in FIG. 8b.

After a first iteration of alignment by the bond head alignment apparatus 110, the tilt angles of the bond head alignment apparatus 110 relative to the bond stage 104 are again measured by the sensor to determine the parallelism of the die collet 112 relative to the bond stage 104, before the measured tilt angles of the bond head alignment apparatus 110 relative to the bond stage 104 are fed back to the processor. The processor then sends a controlling signal to actuate the solenoid actuators 118 to fine-tune the alignment of the bond head alignment apparatus 110 relative to the bond stage 104 for higher degree of accuracy. Various iterations of the alignment of the bond head alignment apparatus 110 may be performed to arrive at a desired accuracy resolution.

By incorporating the bond head alignment apparatus 110 as part of the bond head 100 of the die bonder, the die collet 112 can thus be aligned with respect to the bond stage 104 to maintain the parallelism of the die collet 112 relative to the bond stage 104. Advantageously, the bond head alignment apparatus 100 may ensure a high degree of quality and reliability of the die bonding process.

Various embodiments of the bond head alignment apparatus 110 can also be envisaged without departing from the scope of the present invention. For instance, the orthogonal rotational axes as defined by the first and second sets of joints 200a-b, 202a-b of the ring member 114 may be arranged on different horizontal planes instead of a common horizontal plane. Moreover, the plurality of slots 116b of the ring member 114 may be omitted, as long as the solenoid actuators 118 are configured to rotate the ring member 114 about two orthogonal axes for aligning the die collet 112 relative to the bond stage 104 for die bonding. Further, the solenoid actuators 118 may also be engageable to the ring member 114 using clamps, instead of via the bore openings 116a of the ring member 114. It should also be appreciated that other types of linear actuators may be used in the bond head alignment apparatus 110 besides the solenoid actuators 118, as long as they are operable to rotate the ring member 114 to align the die collet 112 with respect to the bond stage 104.

The invention claimed is:

1. An apparatus for aligning a bonding tool of a die bonder with respect to a bond stage, the apparatus comprising:
   a connecting member to which the bonding tool is coupleable such that the connecting member is located between the bonding tool and a main body of a die bonder; and
   a plurality of actuators engaged to the connecting member, wherein the plurality of actuators are actuable to rotate the connecting member and the bonding tool relative to the main body of the die bonder about a plurality of axes, to align the bonding tool with respect to the bond stage.

2. The apparatus of claim 1, wherein the connecting member comprises a plurality of openings.

3. The apparatus of claim 2, wherein the plurality of openings of the connecting member include a plurality of bore openings extending from an upper surface of the connecting member, and each of the plurality of actuators is engageable to the connecting member via a respective one of the plurality of bore openings.

4. The apparatus of claim 2, wherein the plurality of openings of the connecting member include a plurality of slots around the connecting member such that a first set of joints is formed between adjacent slots, the first set of joints defining one of the plurality of axes about which the connecting member is rotatable.

5. The apparatus of claim 4, wherein each joint of the first set of joints defines an apex of an inverted V-shaped cutout from a side view of the connecting member.

6. The apparatus of claim 4, further comprising a second set of joints on the upper surface of the connecting member, the second set of joints defining another of the plurality of axes about which the connecting member is rotatable.

7. The apparatus of claim 6, wherein each joint of the second set of joints defines a base of a V-shaped cutout from a side view of the connecting member.

8. The apparatus of claim 6, wherein the axes defined by the first and second sets of joints lie on a same plane.

9. The apparatus of claim 6, wherein the axes defined by the first and second sets of joints are mutually orthogonal.

10. The apparatus of claim 1, wherein each of the plurality of actuators is a solenoid actuator.

11. The apparatus of claim 1, further comprising a plurality of linear encoders coupled to the connecting member for measuring displacements of the connecting member when the connecting member is actuated by the plurality of actuators.

12. The apparatus of claim 10, wherein each of the plurality of linear encoders is an optical encoder.

13. The apparatus of claim 1, further comprising a bonding tool holder for coupling the bonding tool of the die bonder to the connecting member, wherein the bonding tool holder comprises:
a bushing bearing; and
a bushing shaft coupled to the bushing bearing,
wherein the bushing bearing is coupled to the connecting member, and the bonding tool is coupleable to the bushing shaft, so that a rotary motion of the connecting member is transferrable to the bonding tool via the bonding tool holder.

14. A die bonder bond head comprising:
a main body;
the apparatus of claim 1 coupled to the main body; and
a bonding tool coupled to the apparatus,
wherein the bonding tool is actuable by the apparatus relative to the main body for alignment with respect to a bond stage.

15. The die bonder bond head of claim 14, wherein the alignment apparatus is movable along a longitudinal axis of the main body to press against a surface of the main body, so as to secure the alignment of the bonding tool in position.

* * * * *